(12) United States Patent
Marien et al.

(10) Patent No.: US 11,373,787 B2
(45) Date of Patent: Jun. 28, 2022

(54) PRODUCTION METHOD FOR AN ELECTRICAL RESISTANCE ELEMENT AND CORRESPONDING RESISTANCE ELEMENT

(71) Applicants: Isabellenhuette Heusler GmbH & Co. KG, Dillenburg (DE); Schunk Sintermetalltechnik GmbH, Thale (DE)

(72) Inventors: Jan Marien, Herborn (DE); Jens Hartmann, Eschenburg (DE); Petra Schmidt, Eschenburg (DE); Andreas Baum, Bad Endbach (DE); Phillip Prinz, Schoeffengrund (DE); Steffen Burk, Gladenbach (DE); Ingolf Langer, Quedlinburg (DE); Alexander Witt, Ballenstedt (DE); Joerg Ziesche, Thale (DE); Sieglinde Mueller, Thale (DE)

(73) Assignees: Isabellenhuette Heusler GmbH & Co. KG, Dillenburg (DE); Schunk Sintermetalltechnik GmbH, Thale (DE)

( * ) Notice: Subject to any disclaimer, the term of this patent is extended or adjusted under 35 U.S.C. 154(b) by 0 days.

(21) Appl. No.: 17/047,137

(22) PCT Filed: Aug. 9, 2019

(86) PCT No.: PCT/EP2019/071395
§ 371 (c)(1),
(2) Date: Oct. 13, 2020

(87) PCT Pub. No.: WO2020/048726
PCT Pub. Date: Mar. 12, 2020

(65) Prior Publication Data
US 2021/0193356 A1    Jun. 24, 2021

(30) Foreign Application Priority Data

Sep. 7, 2018 (DE) .......................... 102018121902.4

(51) Int. Cl.
*H01C 17/065* (2006.01)
*H01C 7/06* (2006.01)

(52) U.S. Cl.
CPC ......... *H01C 17/06526* (2013.01); *H01C 7/06* (2013.01); *H01C 17/06593* (2013.01)

(58) Field of Classification Search
CPC ........ H01C 17/06526; H01C 17/06593; H01C 7/06
See application file for complete search history.

(56) References Cited

U.S. PATENT DOCUMENTS 5,683,566 A    11/1997  Hetzler
5,999,085 A *  12/1999  Szwarc ................... H01C 7/13
                                                           338/309

(Continued)

FOREIGN PATENT DOCUMENTS

DE          4339551 C1    10/1994
DE     102005059561 A1     6/2007

(Continued)

OTHER PUBLICATIONS

English-language abstract for DE 102005059561(2007).

(Continued)

*Primary Examiner* — Kyung S Lee
(74) *Attorney, Agent, or Firm* — Caesar Rivise, PC

(57) ABSTRACT

The invention relates to a production method for an electrical resistance element (for example a shunt) with the following steps: —providing a resistance alloy in powder form, and—forming the resistance element from the powdered (Continued)

resistance material. The invention also relates to a correspondingly produced resistance element.

29 Claims, 7 Drawing Sheets

(56) References Cited

U.S. PATENT DOCUMENTS

| | | | |
|---|---|---|---|
| 8,164,414 | B2 | 4/2012 | Tanaka et al. |
| 9,437,353 | B2 * | 9/2016 | Hetzler .................... H01C 1/14 |
| 9,972,424 | B2 * | 5/2018 | Hetzler .................... H01C 1/01 |
| 10,151,779 | B2 * | 12/2018 | Hetzler ................ G01R 35/005 |
| 2002/0130759 | A1 * | 9/2002 | Szwarc .................... H01C 7/06 |
| | | | 338/309 |
| 2006/0099103 | A1 | 5/2006 | Wohlfromm et al. |
| 2006/0158304 | A1 | 7/2006 | Moriya |
| 2009/0045908 | A1 | 2/2009 | Tanaka et al. |
| 2009/0148657 | A1 | 6/2009 | Ihle et al. |
| 2009/0195348 | A1 | 8/2009 | Smith et al. |
| 2012/0229247 | A1 | 9/2012 | Yoshioka |
| 2012/0258008 | A1 | 10/2012 | Hamilton |
| 2016/0263653 | A1 | 9/2016 | Kim et al. |
| 2020/0051719 | A1 * | 2/2020 | Langer ............. H01C 17/06526 |

FOREIGN PATENT DOCUMENTS

| | | |
|---|---|---|
| EP | 0605800 A1 | 7/1994 |
| EP | 2244989 B1 | 7/2016 |
| EP | 3309800 A1 | 4/2018 |
| JP | 2014103076 A | 6/2014 |
| KR | 1020160101251 | 8/2016 |
| WO | 2004039522 A1 | 5/2004 |
| WO | 2015102732 A2 | 7/2015 |

OTHER PUBLICATIONS

English-language abstract for EP 0605800 (1994).
English-language abstract for JP 2014103076 (2014).
English-language abstract for KR 20160101251 (2016).
International Search Report for PCT/EP2019/071395 dated Nov. 28, 2019.
Chinese Office Action dated Feb. 25, 2022.

* cited by examiner

PRODUCTION METHOD FOR AN ELECTRICAL RESISTANCE ELEMENT AND CORRESPONDING RESISTANCE ELEMENT

CROSS-REFERENCE TO RELATED APPLICATIONS

This application is a U.S. National Phase Application of PCT/EP2019/071395, filed Aug. 9, 2019, which claims priority to DE 102018121902.4, filed Sep. 7, 2018, the contents of which applications are incorporated herein by reference in their entireties for all purposes.

BACKGROUND OF THE INVENTION

The invention concerns a method of manufacturing an electrical resistor element, in particular for a current sense resistor. Furthermore, the invention relates to a resistor which was manufactured using the method of manufacturing according to the invention.

EP 0 605 800 A1 describes a method of manufacturing a current sense resistor as shown in FIG. 1. In this method, a strip of a resistance alloy (e.g. Manganese®) is welded along its two longitudinal edges to a strip of a conductor material (e.g. copper), resulting in a composite strip ("tri-band"). Then the individual current sense resistors are separated from the composite material strip, which can be done in an automatic punching and bending machine, for example. This well-known manufacturing method enables a cost-effective mass production of current sense resistors.

However, the disadvantage of this well-known manufacturing method is the limited freedom in the design of the current sense resistor, since the current sense resistor is cut from the flat composite material strip, so that the top and bottom of the finished current sense resistor are parallel.

The invention is therefore based on the task to increase the freedom of design with respect to the shape of a current sense resistor.

This task is solved by a manufacturing method according to the invention or by a resistor manufactured accordingly.

BRIEF SUMMARY OF THE INVENTION

The manufacturing method in accordance with the invention initially provides a resistance alloy in powder form, whereby the powdery resistance alloy is initially not subject to any restrictions in terms of shape. The resistor element is then formed from the powdery resistance material within the framework of the manufacturing method according to the invention. The manufacturing method according to the invention does not lead to any restrictions regarding the shape of the finished resistor element.

It should be mentioned that the manufacturing method according to the invention is not only suitable for the production of low ohmic current sense resistors, which can be used for current measurement according to the known four-wire technology. Rather, the manufacturing method according to the invention is generally suitable for the manufacture of electrical resistor elements.

In a preferred embodiment of the invention, the resistor element is formed from the powdery resistive material by metal injection molding (MIM: Metal Injection Molding), whereby the resistor element is first formed into a so-called green part.

However, within the scope of the invention, it is also possible to use a multi-component metal powder injection molding process to form the resistor element, in which the resistor element made of the powdery resistance alloy is joined to two connection parts made of a powdery conductor material (e.g. copper, copper alloy).

Within the scope of the manufacturing method according to the invention, it is preferably intended that the powdery resistance alloy (e.g. Manganin®) and/or the powdery conductor material (e.g. copper, copper alloy) is mixed with a binder to form a so-called feedstock before molding. The binder is preferably an organic binder or a mixture of several, preferably organic components. For example, the feedstock can contain 50-80 weight percent of the resistance alloy and 20-50 percent of the organic components.

After molding, the green part is then preferably debound to a so-called brown part, whereby the binder is at least partially removed from the green part.

The brown part can then be sintered to the finished resistor element.

Subsequently, the resistor element can be reworked, whereby, for example, the resistance value of the resistor element can be corrected or adjusted by milling or punching.

Finally, the resistor element can then be connected to two electrically conductive connection parts, for example by welding, soldering or sintering the connection parts to the resistor element.

The invention is not limited to certain materials or material compositions with respect to the binder. For example, the following materials are suitable as binders within the scope of the manufacturing method according to the invention: Polyamide, polylyoxymethylene, polycarbonate, styrene-acrylonitrile copolymer, polyimide, natural wax and oil, thermoset, cyanate, polypropylene, polyacetate, polyethylene, ethylene-vinyl acetate, polyvinyl alcohol, polyvinyl chloride, polystyrene, polymethyl methacrylate, aniline, water, mineral oil, agar, glycerine, polyvinyl butyryl, Polybutyl methacrylate, cellulose, oleic acid, phthalate, kerosene, wax, in particular carnauba wax, ammonium, polyacrylate, diglyceride stearates and oleates Glyceryl monostearates, isopropyl titanates, lithium stearates, monoglycerides, formaldehydes, octyl acid phosphates, olefin sulphonates, phosphate esters, stearic acid, zinc stearates It should also be mentioned that the binder may also contain the following components, for example:
a) 10-50 weight percent polyamide,
b) 40-80 weight percent of fatty alcohol; and
c) 2-20 weight percent of an organic acid.

It is also possible that the binder contains the following components:
a) 50-96 weight percent of one or more polyoxymethylene homopolymers or polyoxymethylene copolymers,
b) 2-35 weight percent of one or more polyolefins and
c) 2 40 weight percent of poly-1,3-dioxepan or poly-1,3-dioxolane or mixtures thereof.

Also with regard to the powdery resistance alloy, the manufacturing method according to the invention is not limited to certain resistance alloys. Preferably, however, the powdery resistance alloy contains copper or nickel as its main component.

For example, the powdery resistance alloy may contain the following alloying elements:
a) 0.01-95.0 weight percent copper,
b) 0.01-80.0 weight percent nickel,
c) 0.01-30.0 weight percent manganese,
d) 0.001-5.0 weight percent tin,
e) 0.001-22.0 weight percent chromium,
f) 0.001-5.0 weight percent aluminum,
g) 0.001-2.0 weight percent silicon,
h) 0,001-1.5 weight percent of iron; and/or i) not more than 1.0 weight percent of other alloying elements.

Alternatively, it is possible that the powdery resistance alloy contains the following alloying constituents:
  a) 50.0-55.0 weight percent copper,
  b) 42.0-46.0 weight percent nickel,
  c) 0.5-2.0 weight percent manganese, and
  d) not more than 1.5 weight percent of other alloying elements.

A further example of a powdery resistance alloy according to the invention contains the following alloying constituents:
  a) 81.0-89.6 weight percent copper,
  b) 10.0-14.0 weight percent manganese,
  c) 0.4-4.0 weight percent nickel; and
  d) not more than 1.0 weight percent of other alloying elements.

In another embodiment, the powdery resistance alloy contains the following alloying constituents:
  a) 60.0-69.0 weight percent copper,
  b) 23.0-27.0 weight percent manganese,
  c) 8.0-12.0 weight percent nickel; and
  d) not more than 1.0 weight percent of other alloying elements.

The following alloying constituents are contained in another example of the resistance alloy according to the invention:
  a) 88.0-92.5 weight percent copper,
  b) 6.0-8.0 weight percent manganese,
  c) 1.5-3.0 weight percent tin, and
  d) not more than 1.0 weight percent of other alloying elements.

Finally, within the scope of the invention, it is possible that the powdery resistance alloy contains the following alloying elements:
  a) 62.0-81.4 weight percent nickel,
  b) 16.0-22.0 weight percent chrome,
  c) 2.0-4.0 weight percent aluminum,
  d) 0.4-2.0 weight percent silicon,
  e) 0.1-5.0 weight percent manganese,
  f) 0.02-3.0 weight percent copper,
  g) 0.1-1.0 weight percent iron; and
  h) not more than 1.0 weight percent of other alloying elements.

The manufacturing method according to the invention allows the finished resistor element to advantageously exhibit a temperature-stable electrical resistance value, the resistance value having a temperature coefficient of less than 50 ppm/K with respect to a temperature range from +20° C. to +60° C.

In addition, the manufacturing method according to the invention enables the production of an electrical resistor with a resistance value with a good long-term stability, i.e. with a long-term drift of less than 10% according to AEC-Q200.

The resistor alloy used is preferably of low resistance and has a specific electrical resistance of less than $20 \cdot 10^{-7}$ Ωm, $10 \cdot 10^{-7}$ Ωm, $5 \cdot 10^{-7}$ Ωm or $3 \cdot 10^{-7}$ Ωm.

The conductor material of the connection parts, on the other hand, is preferably even lower-resistance than the resistance alloy and preferably has a specific electrical resistance of less than $5 \cdot 10^{-7}$ Ωm, $2 \cdot 10^{-7}$ Ωm, $1 \cdot 10^{-7}$ Ωm, $5 \cdot 10^{-8}$ Ωm or $2 \cdot 10^{-8}$ Ωm.

The conductor material of the connection parts therefore preferably has a lower specific electrical resistance than the resistance alloy of the resistor element.

It should also be mentioned that the resistance alloy in the thermoelectric series of voltages preferably has a thermoelectric voltage of less than ±5 mV/100 K, ±0.5 mV/100 K, ±0.3 mV/100 K or ±0.2 mV/100 K compared to copper.

Furthermore, within the scope of the manufacturing method according to the invention, it is possible to combine different resistance layers in parallel or series connection in order to achieve an optimization of the electrical properties. The electric current can then flow in parallel through the different resistance layers or successively in series through the different resistance layers.

In addition, the manufacturing method according to the invention also enables the combination of different materials to form the resistance layer in parallel and/or series connection in order to achieve an optimization of the mechanical properties.

Furthermore, different materials can be combined (in parallel or in series) to the resistance layer within the scope of the manufacturing method according to the invention in order to optimize the thermal properties.

Furthermore, it should be mentioned that the manufacturing method according to the invention offers the possibility to form heat sinks (e.g. cooling fins) on the resistor element.

Furthermore, within the scope of the manufacturing method according to the invention, electrical connecting elements can also be molded onto the resistor element, such as plug contacts or solder contacts.

In an embodiment of the invention, the finished resistor element is a coaxial resistor in which the electric current in the coaxial resistor flows coaxially in opposite directions, which is known from the state of the art.

However, the invention not only claims protection for the manufacturing method according to the invention described above. Rather, the invention also claims protection for the novel use of such a manufactured component as a resistor element. Furthermore, the invention also claims protection for a finished resistor which was manufactured in the manner described above according to the manufacturing method according to the invention.

BRIEF DESCRIPTION OF THE DRAWINGS

Other advantageous further developments of the invention are marked in the dependent claims or are explained in detail below together with the description of the preferred examples of the invention using the figures. They show:

DETAILED DESCRIPTION OF PREFERRED EMBODIMENTS

Figure 1:
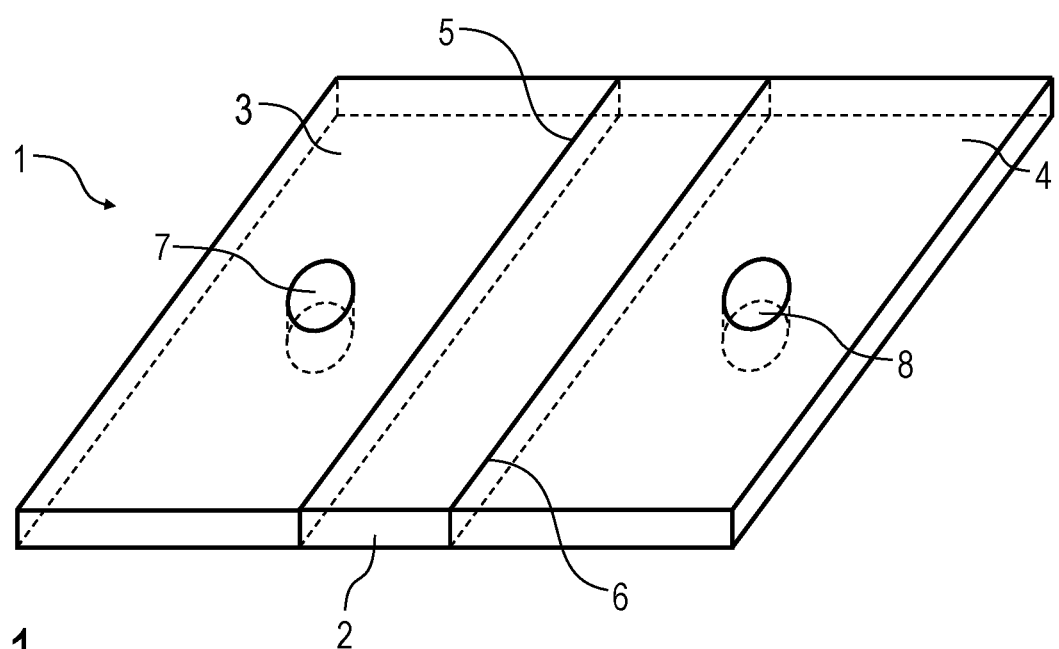
FIG. 1 shows a perspective view of a conventional current sense resistor manufactured in a conventional way.

FIG. 1 shows a perspective view of a conventional current sense resistor 1, which is used for current measurement according to the well-known four-wire technique and is cut from a composite material strip as described in EP 0 605 800 A1.

The current sense resistor 1 essentially consists of a resistor element 2 made of a resistance alloy (e.g. Manganese®) and two connection parts 3, 4 made of a conductor material (e.g. copper), whereby the resistor element 2 is connected along its longitudinal edges to the connection parts 3 and 4 respectively by two weld seams 5, 6.

In the two connection parts 3, 4 there are holes 7, 8, which serve as connecting elements to facilitate the electrical contact.

A disadvantage of this known current sense resistor 1 is the fact that the shape is limited by the cross-section of the underlying composite material strip, so that not any arbitrary shapes of the current sense resistor are possible.

Figure 2:
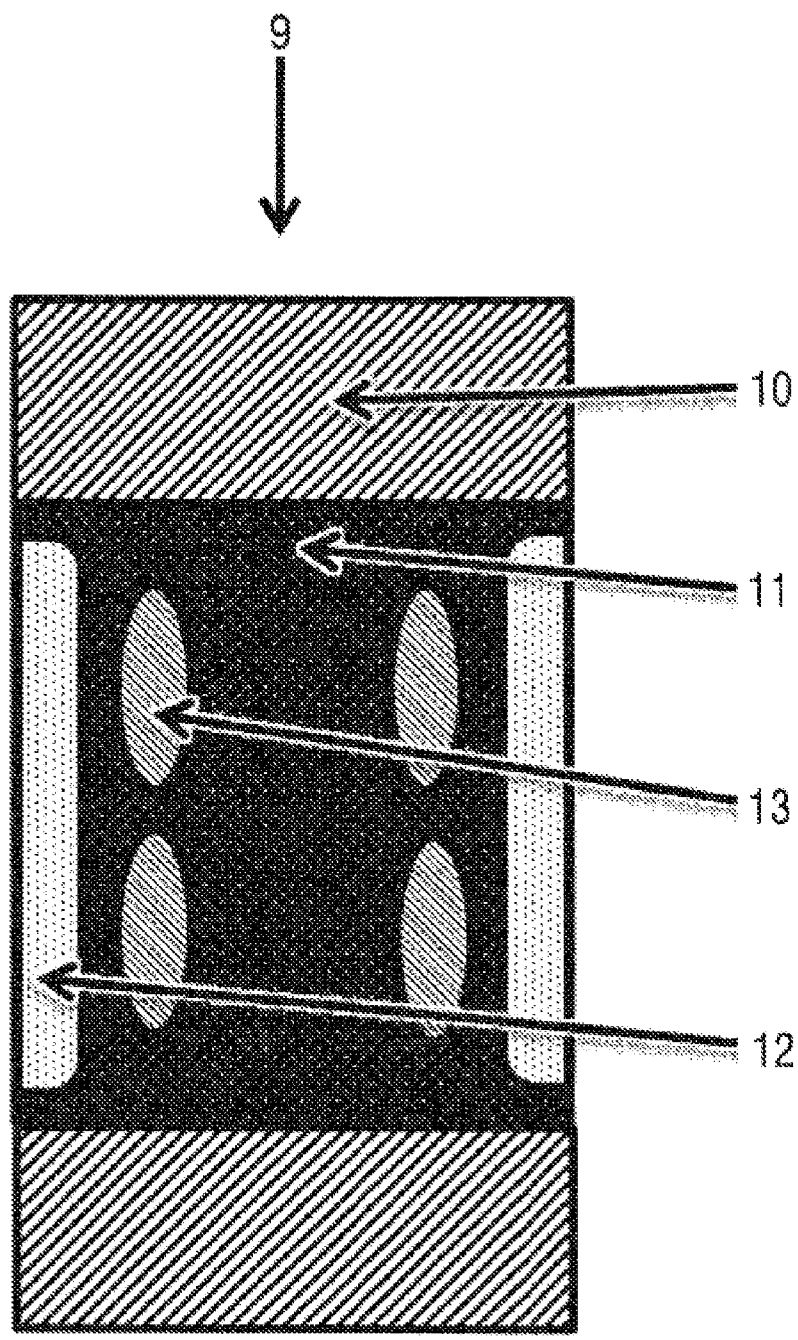
FIG. 2 shows a top view of a resistor element produced by the manufacturing method according to the invention.

FIG. 2 shows a top view of a resistor element 9 according to the invention, which was produced by metal injection molding (MIM: Metal Injection Molding) and can therefore take on a variety of shapes.

The drawing shows that the resistor element 9 has joining surfaces 10 in order to be able to connect the resistor element 9 with connection parts.

Furthermore, the drawing shows a sintered resistance material 11, which can take on different shapes.

At the side of the resistor element 9 there can be areas 12 for the adjustment of the resistance value.

Furthermore, the drawing shows elliptical areas 13 for contacting measuring terminals.

Figure 3:
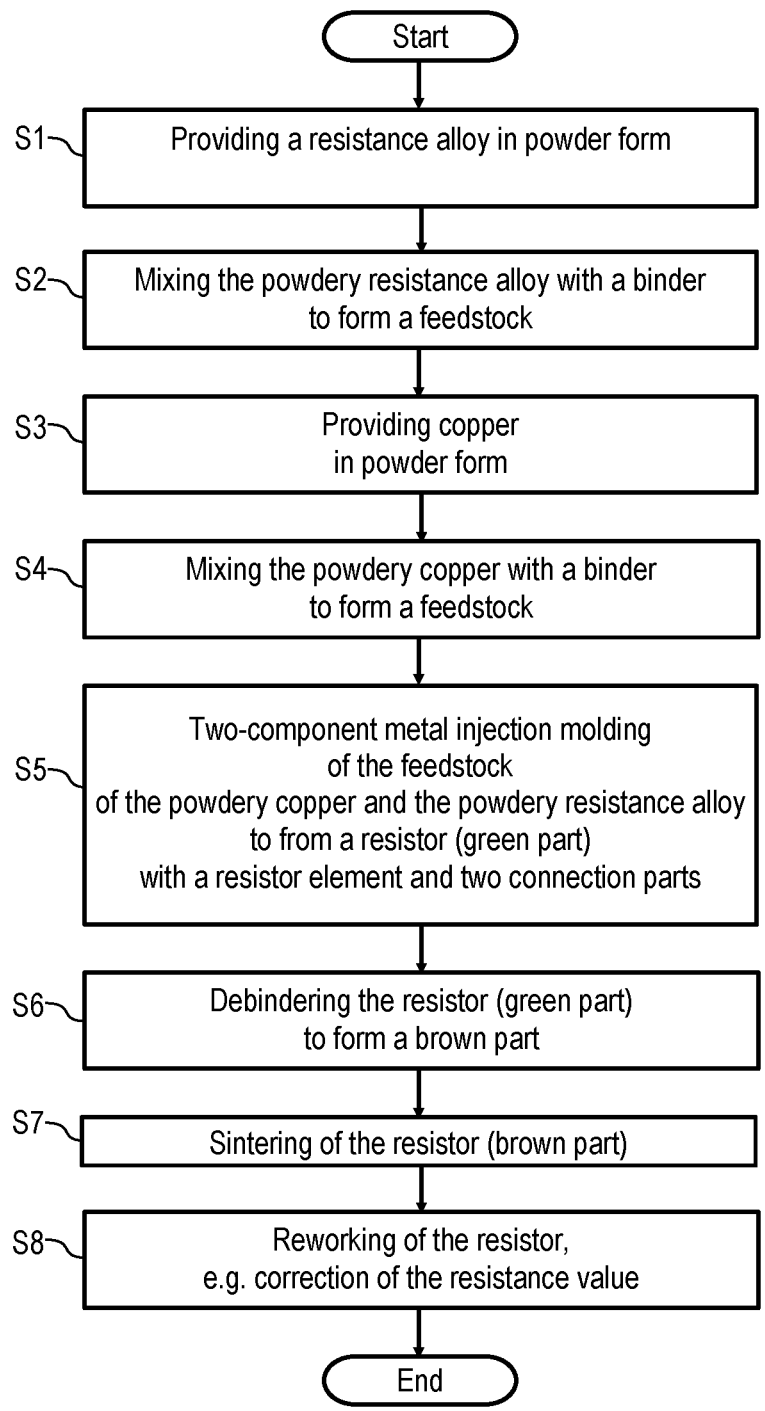
FIG. 3 is a flowchart illustrating the manufacturing method by two-component metal injection molding according to the invention.

In the following, the flow chart as shown in FIG. 3 is explained, which is an embodiment of the manufacturing method according to the invention.

In a first step S1, a resistance alloy in powder form is first provided.

In a second step S2, the powdery resistance alloy is then mixed with a binder to form a so-called feedstock.

In a step S3, copper is provided in powder form for the connection parts.

The powdery copper is then also mixed with a binder in a step S4 to form a feedstock.

In a further step S5, a two-component metal injection molding of the feedstock of the powdery copper and the feedstock of the powdery resistive alloy into a resistor (green part) with one resistor element and two connection parts is then carried out.

In a next step S6 the resistor (green part) is then debound, i.e. the binder is at least partially removed, so that a so-called brown part is produced.

In a further step S7, the brown part is then sintered.

Finally, in a step S8, the resistor can be reworked, e.g. to correct the resistance value.

Figure 4:
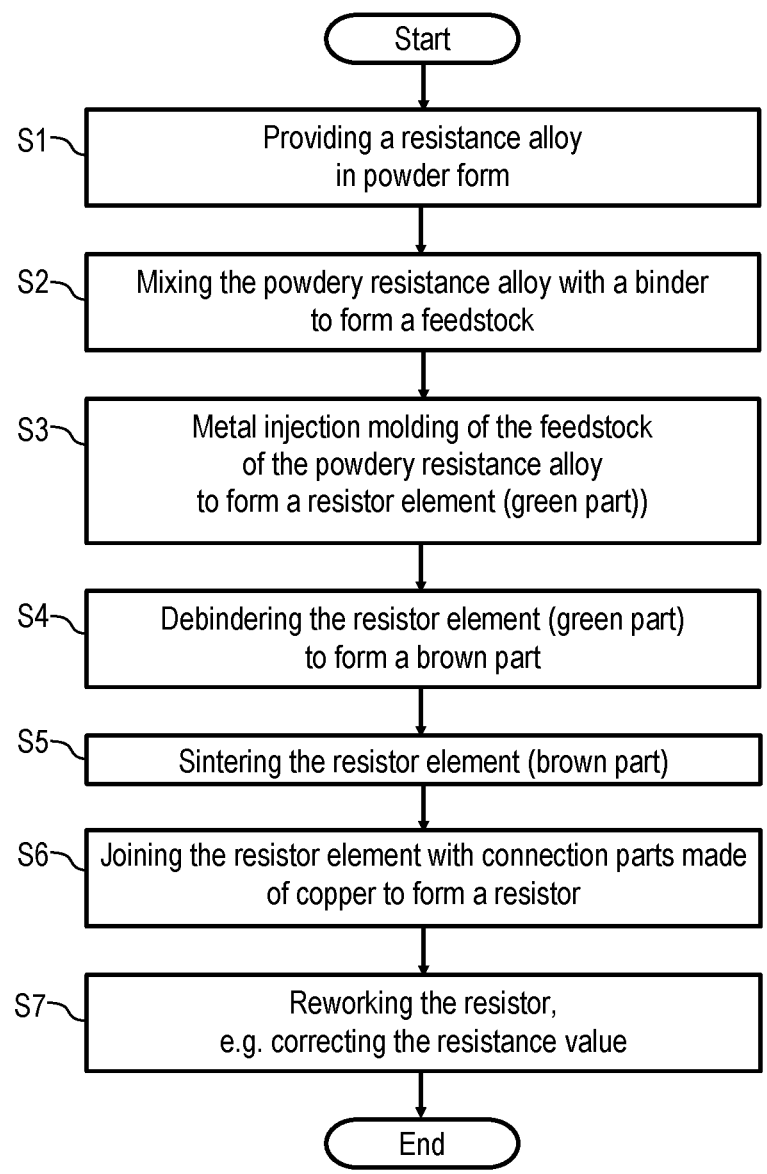
FIG. 4 shows another flow chart to illustrate the manufacturing method according to the invention using metal injection molding.

In the following, the flow chart as shown in FIG. 4 is explained, which provides an alternative example of the manufacturing method according to the invention.

In a first step S1, a resistance alloy in powder form is prepared again.

In a second step S2, the powdery resistance alloy is then mixed with a binder to form a feedstock.

In a further step S3, the feedstock of the powdery resistance alloy is then injection molded into a resistor element (green part).

In the next step S4 the green part is debound to a brown part, i.e. the previously added binder is at least partially removed.

In the next step S5, the brown part of the resistor element is then sintered.

In a further step S6, the resistor element is then joined together with the copper connection parts to form a resistor.

Finally, in a step S7, the resistor can be reworked, e.g. to correct the resistance value.

The embodiment in FIG. 4 differs from the embodiment in FIG. 3 in that the connection parts in the embodiment in FIG. 4 are attached after metal injection molding, whereas the connection parts in the embodiment in FIG. 3 are molded in the two-component metal injection molding process.

Figure 5A:
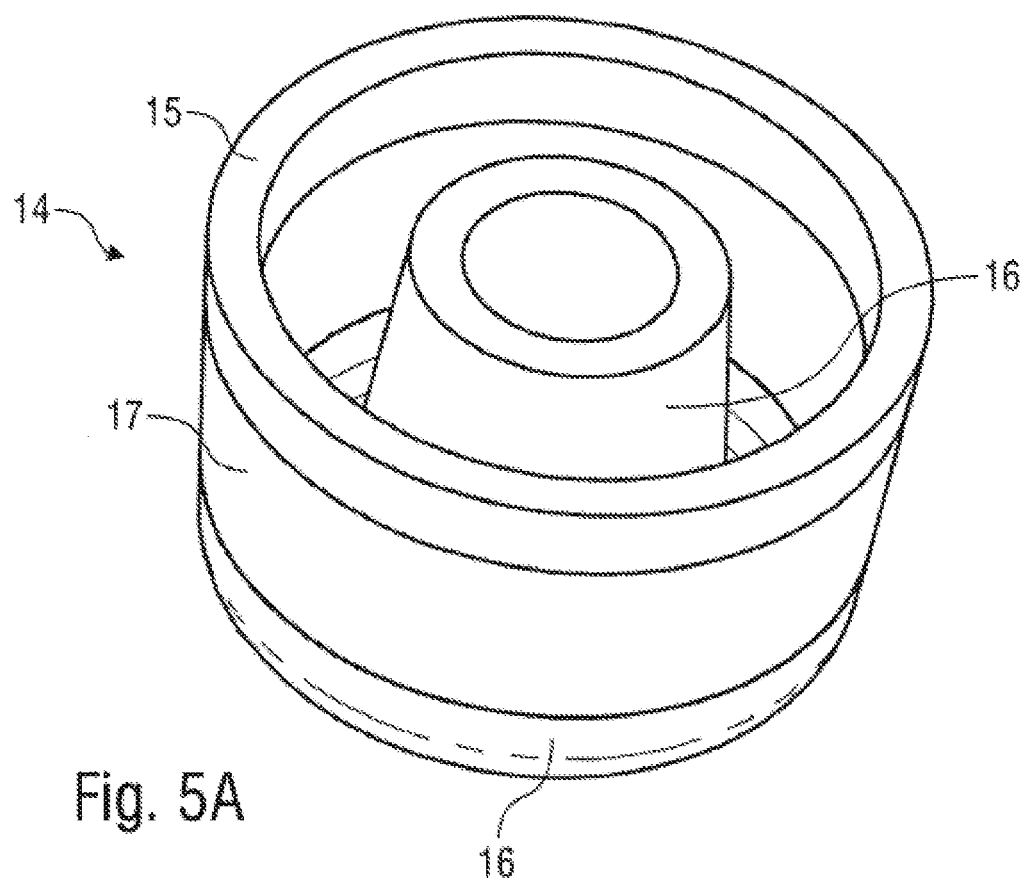
FIGS. 5A and 5B show different perspective views of a coaxial resistor manufactured by the method of manufacture according to the invention, FIGS. 6A and 6B different perspective views of a multiple bent current sense resistor, and FIGS. 7A and 7B different perspective views of a resistor according to the invention with molded-on cooling fins.
Figure 5B:
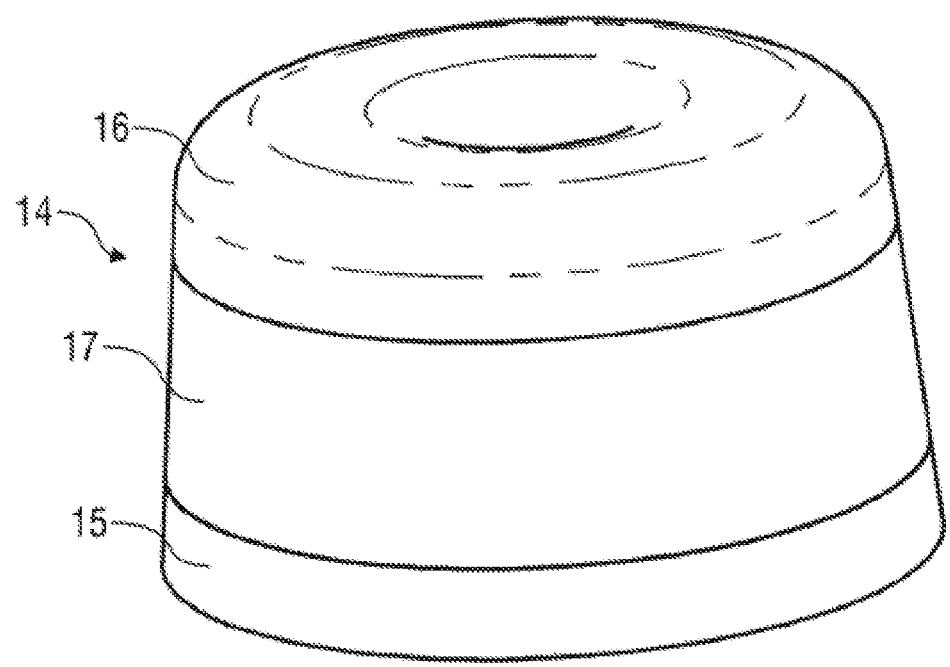

In the following, the example shown in FIGS. 5A and 5B is described. These drawings show a coaxial resistor 14 with two connection parts 15, 16 made of a conductor material (e.g. copper) and a resistor element 17 made of a resistance alloy inserted between them.

The manufacturing method in accordance with the invention allows a large scope of design regarding the outer shape of the coaxial resistor 14, which can have complex curvatures.

Figure 6A:
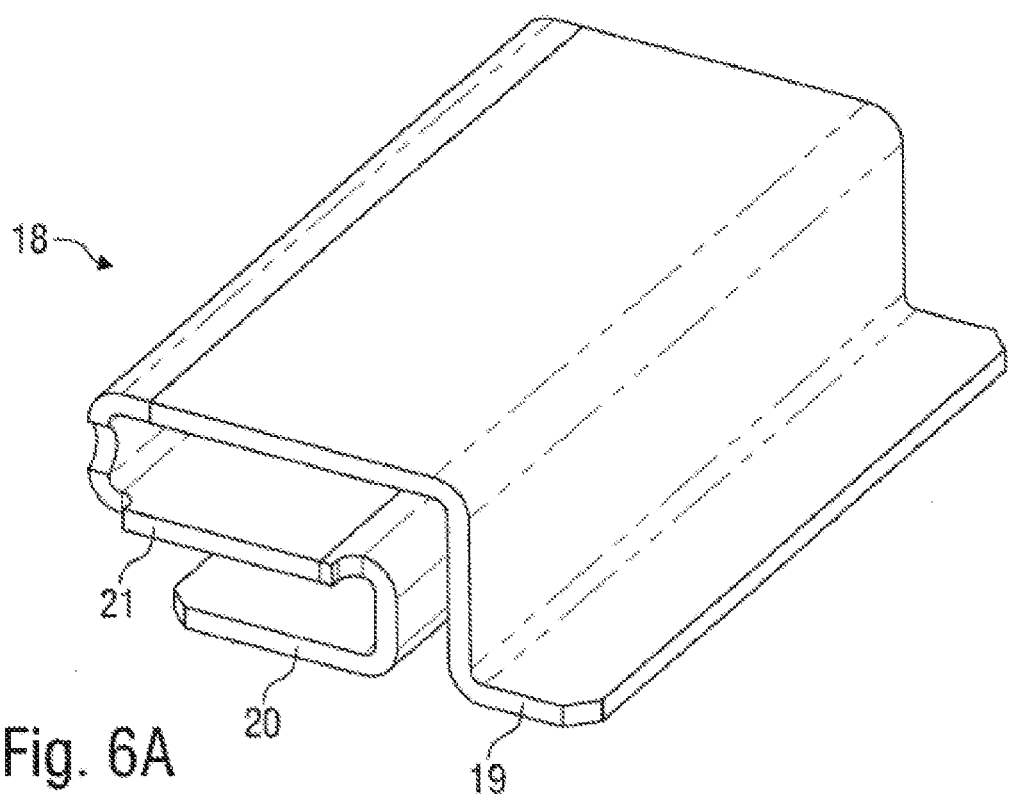
Figure 6B:
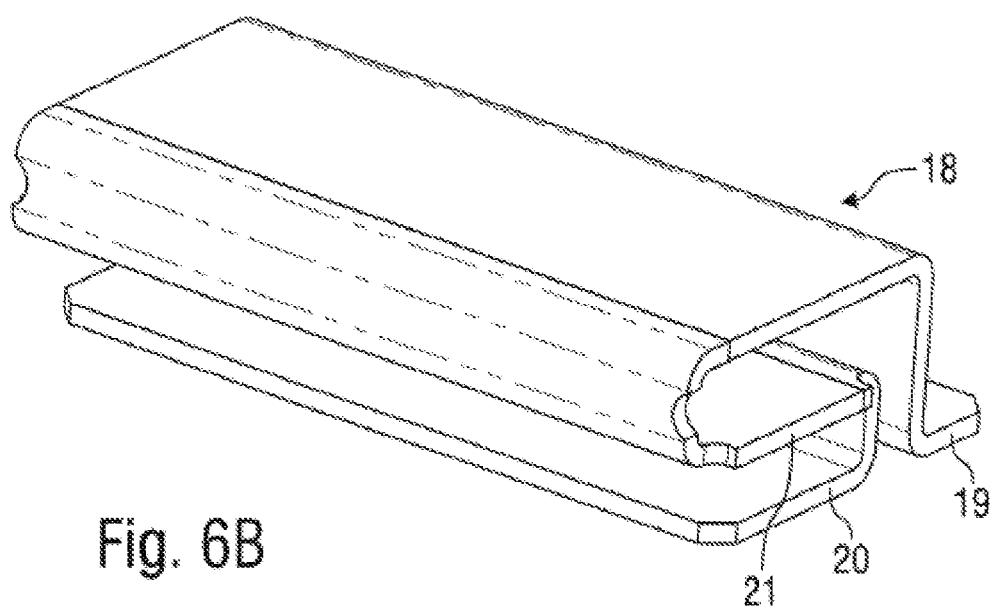

In the following, the embodiment according to FIGS. 6A and 6B is described. The drawings show different perspective views of a current sense resistor 18 with connectors 19, 20 made of a conductor material (e.g. copper) and a resistor element 21 made of a resistance alloy inserted in between.

The manufacturing method according to the invention allows complex bends of the current sense resistor 18.

Figure 7A:
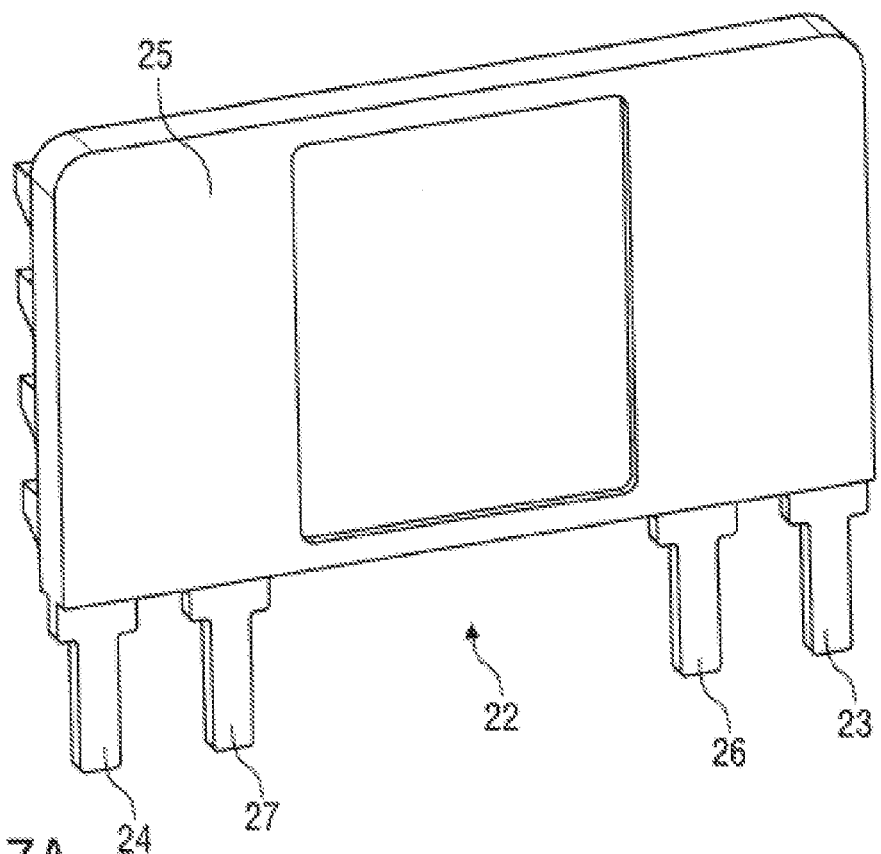
Figure 7B:
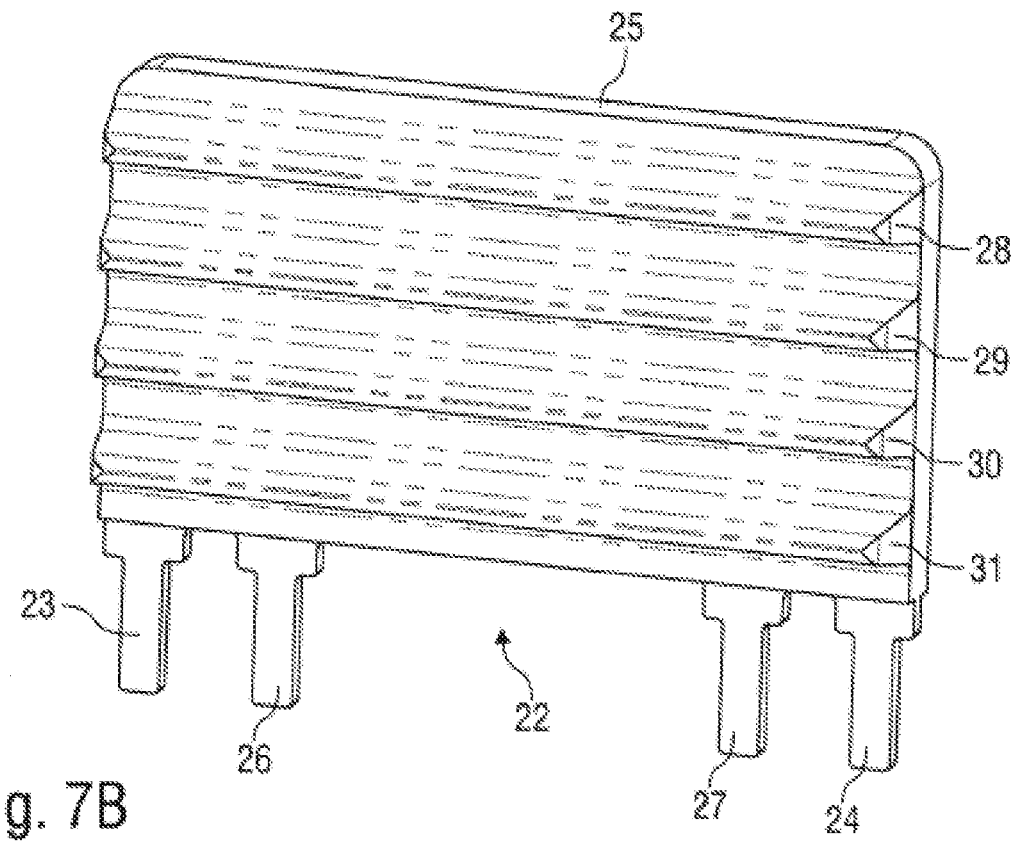

In the following, we will now finally describe the embodiment according to FIGS. 7A and 7B.

The drawings show a current sense resistor 22, which was manufactured according to the manufacturing method according to the invention and has two connection parts 23, 24 and a resistor element 25.

In addition, the drawings show two voltage measuring contacts 26, 27 for measuring the voltage dropping along the resistor element 25.

Finally, the drawings show cooling fins 28-31, which are molded onto the resistor element 25 and dissipate heat loss during operation.

The invention is not limited to the preferred embodiments described above. Rather, a large number of variants and modifications are possible, which also make use of the inventive idea and therefore fall within the scope of protection. In particular, the invention also claims protection for the subject matter and the features of the sub-claims independently of the claims referred to in each case and in particular without the features of the main claim. The invention thus comprises a large number of inventive aspects which enjoy protection independently of one another.

LIST OF REFERENCE SIGNS

1 Current sense resistor
2 Resistor element
3, 4 Connection parts
5, 6 welding seams
7, 8 Drillings
9 Resistor element
10 Joining surfaces
11 Resistance material
12 Areas for adjusting the resistance value
13 Elliptical areas for contacting measurement connections
14 Coaxial resistor
15, 16 Connection parts
17 Resistor element
18 Current sense resistor
19, 20 Connection parts
21 Resistor element 22 Current sense resistor
23, 24 Connection parts
25 Resistor element
26, 27 Voltage measuring contacts
28-31 Cooling fins

The invention claimed is:

1. A method of manufacturing an electrical resistor element, comprising the following steps:
 a) providing a powdery resistance alloy which is a resistance alloy in powder form, and
 b) forming the resistor element from the powdery resistance alloy by multi-component metal powder injection molding, wherein the following components of resistor are joined together to form a green part:
  (i) the resistor element which is made of the powdery resistance alloy, and
  (ii) at least two connection parts made of powdery conductor material.

2. The method of manufacturing according to claim 1, further comprising the following steps:
 a) mixing at least one of the powdery resistance alloy and the powdery conductor material with a binder to form a feedstock before molding,
 b) debinding the green part to a brown part after molding, whereby the binder is at least partially removed from the green part,
 c) sintering the brown part to the finished resistor element,
 d) reworking of the finished resistor element, and
 e) joining together the finished resistor element with the at least two connection parts.

3. The method of manufacturing according to claim 1, wherein the method further comprises mixing at least one of the powdery resistance alloy and the powdery conductor material with a binder to form a feedstock of the resistance alloy before molding, and the feedstock of the resistance alloy contains the following constituents:
 a) 50-80 weight percent of the resistance alloy and
 b) 20-50 weight percent of organic components.

4. The method of manufacturing according to claim 1, wherein the method further comprises a step of reworking the resistor element by a correction of a resistance value of the resistor element.

5. The method of manufacturing according to claim 1, wherein the method further comprises a step of joining together a finished resistor element with the at least two connection parts by one of the following joining methods:
 a) welding,
 b) soldering, or
 c) sintering.

6. The method of manufacturing according to claim 1, wherein the method further comprises mixing at least one of the powdery resistance alloy and the powdery conductor material with a binder to form a feedstock of the resistance alloy before molding, and the binder contains at least one of the following materials:
 a) polyamide,
 b) polyoxymethylene,
 c) polycarbonate,
 d) styrene-acrylonitrile copolymer,
 e) polyimide,
 f) natural wax and oil,
 g) thermoset,
 h) cyanates,
 i) polypropylene,
 j) polyacetates,
 k) polyethylenes,
 l) ethylene vinyl acetates,
 m) polyvinyl alcohols,
 n) polyvinyl chlorides,
 o) polystyrene,
 p) polymethyl methacrylates,
 q) aniline,
 r) water,
 s) mineral oil,
 t) agar,
 u) glycerol,
 v) polyvinyl butyryl,
 w) polybutyl methacrylate,
 x) cellulose,
 y) oleic acid,
 z) phthalate,
 aa) kerosene wax,
 ab) wax,
 ac) ammonium,
 ad) polyacrylate,
 ae) diglyceride stearates and oleates,
 af) glyceryl monostearates,
 ag) isopropyl titanates,
 ah) lithium stearates,
 ai) monoglycerides,
 aj) formaldehydes,
 ak) octyl acid phosphates,
 al) olefin sulphonates,
 am) phosphate ester,
 an) stearic acid, and
 ao) zinc stearates.

7. The method of manufacturing according to claim 1, wherein the powdery resistance alloy contains copper or nickel as the main component.

8. The method of manufacturing according to claim 1, wherein the powdery resistance alloy contains the following alloy components:
 a) 0.01-95.0 weight percent copper,
 b) 0.01-80.0 weight percent nickel,
 c) 0.01-30.0 weight percent manganese,
 d) 0.001-5.0 weight percent tin,
 e) 0.001-22.0 weight percent chromium,
 f) 0.001-5.0 weight percent aluminum,
 g) 0.001-2.0 weight percent silicon,
 h) 0.001-1.5 weight percent of iron; and/or
 i) not more than 1.0 weight percent of other alloying elements.

9. The method of manufacturing according to claim 1, wherein the powdery resistance alloy contains the following alloying constituents:
 a) 50.0-55.0 weight percent copper,
 b) 42.0-46.0 weight percent nickel,
 c) 0.5-2.0 weight percent manganese, and
 d) not more than 1.5 weight percent of other alloying elements.

10. The method of manufacturing according to claim 1, wherein the powdery resistance alloy contains the following alloying constituents:
 a) 81.0-89.6 weight percent copper,
 b) 10.0-14.0 weight percent manganese,
 c) 0.4-4.0 weight percent nickel; and
 d) not more than 1.0 weight percent of other alloying elements.

11. The method of manufacturing according to claim 1, wherein the powdery resistance alloy contains the following alloying constituents:
 a) 60.0-69.0 weight percent copper,
 b) 23.0-27.0 weight percent manganese,
 c) 8.0-12.0 weight percent nickel; and d) not more than 1.0 weight percent of other alloying elements.

12. The method of manufacturing according to claim 1, wherein the powdery resistance alloy contains the following alloying elements:
 a) 88.0-92.5 weight percent copper,
 b) 6.0-8.0 weight percent manganese,
 c) 1.5-3.0 weight percent tin, and
 d) not more than 1.0 weight percent of other alloying elements.

13. The method of manufacturing according to claim 1, wherein the powdery resistance alloy contains the following alloying constituents:
 a) 62.0-81.4 weight percent nickel,
 b) 16.0-22.0 weight percent chrome,
 c) 2.0-4.0 weight percent aluminum,
 d) 0.4-2.0 weight percent silicon,
 e) 0.1-5.0 weight percent manganese,
 f) 0.02-3.0 weight percent copper,
 g) 0.1-1.0 weight percent iron; and
 h) not more than 1.0 weight percent of other alloying elements.

14. The method of manufacturing according to claim 1, wherein
 a) the resistor element has an electrical resistance value with a temperature coefficient of less than 50 ppm/K measured between 20° C. and 60° C., and
 b) the resistor element has an electrical resistance value with a long-term drift of less than 10%, and
 c) the resistance alloy has a specific electrical resistance of less than $20 \cdot 10^{-7}$ Ωm; and
 d) the conductor material has a specific electrical resistance of less than $5 \cdot 10^{-7}$ Ωm, and
 e) the conductor material has a lower specific electrical resistance than the resistance alloy, and
 f) the resistance alloy has a thermoelectric emf with respect to copper in the thermoelectric series of voltages of less than ±5 mV/100 K.

15. The method of manufacturing according to claim 1, comprising the following step:
 combining different resistance layers in parallel and/or in series connection to achieve an optimization of the electrical properties.

16. The method of manufacturing according to claim 1, comprising the following step:
 combining different materials to form the resistance layer in parallel and/or in series connection in order to optimize the mechanical properties.

17. The method of manufacturing according to claim 1, comprising the following step:
 combining different materials to form the resistance layer in parallel and/or in series connection in order to optimize the thermal properties.

18. The method of manufacturing according to claim 1, further comprising the following step molding heat sinks onto the resistor element.

19. The method of manufacturing according to claim 18, wherein the heat sinks are cooling fins.

20. The method of manufacturing according to claim 1, further comprising the following step:
 molding electrical connecting elements onto the resistor element.

21. The method of manufacturing according to claim 20, wherein the electrical connecting elements are plug contacts.

22. The method of manufacturing according to claim 1, wherein the resistor element is a coaxial resistor.

23. The method of manufacturing according to claim 1, wherein the resistor element is a current sense resistor.

24. A resistor which is manufactured by the manufacturing method in accordance with claim 1.

25. The resistor according to claim 24, wherein the resistor is a current sense resistor.

26. The resistor according to claim 24, comprising
 a) a first connection part made of the powdery conductor material for introducing an electric current into the resistor,
 b) a second connection part made of the powdery conductor material for diverting the electric current from the resistor, and
 c) the resistor element made of the powdery resistance alloy, which is arranged in the direction of current flow between the first connection part and the second connection part and through which the electric current flows.

27. A method of manufacturing an electrical resistor element, comprising the following steps:
 a) providing a powdery resistance alloy which is a resistance alloy in powder form;
 b) forming the electrical resistor element from the powdery resistance alloy; and
 c) mixing at least one of the powdery resistance alloy and a powdery conductor material with a binder to form a feedstock before molding, wherein the binder contains the following components:
 i) 10-50 weight percent polyamide,
 ii) 40-80 weight percent of fatty alcohol, and
 iii) 2-20 weight percent of organic acid.

28. A method of manufacturing an electrical resistor element comprising the following steps:
 a) providing a powdery resistance alloy which is a resistance alloy in powder form;
 b) forming the electrical resistor element from the powdery resistance alloy; and
 c) mixing at least one of the powdery resistance alloy and a powdery conductor material with a binder to form a feedstock before molding, wherein the binder contains the following components:
 i) 50 to 96 weight percent of one or more polyoxymethylene homopolymers or polyoxymethylene copolymers;
 ii) 2 to 35 weight percent of one or more polyolefins; and
 iii) 2 to 40 weight percent of poly-1,3-dioxepan or poly-1,3-dioxolane or mixtures thereof.

29. A method of using a resistor element comprising the following steps:
 a) providing a powdery resistance alloy which is a resistance alloy in powder form,
 b) forming a resistor element from the powdery resistance alloy by multi-component metal powder injection molding, wherein the following components of a resistor are joined together to form a green part:
 i) the resistor element which is made of the powdery resistance alloy, and
 ii) least two connection parts made of a powdery conductor material, and
 c) using the resistor element.

* * * * *